(12) United States Patent
Wang et al.

(10) Patent No.: US 11,437,323 B2
(45) Date of Patent: Sep. 6, 2022

(54) SILICON INTERPOSER FOR CAPACITIVE COUPLING OF PHOTODIODE ARRAYS

(71) Applicant: HEWLETT PACKARD ENTERPRISE DEVELOPMENT LP, Houston, TX (US)

(72) Inventors: Binhao Wang, Palo Alto, CA (US); Wayne Victor Sorin, Palo Alto, CA (US); Michael Renne Ty Tan, Palo Alto, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 273 days.

(21) Appl. No.: 16/892,263

(22) Filed: Jun. 3, 2020

(65) Prior Publication Data

US 2021/0384132 A1 Dec. 9, 2021

(51) Int. Cl.
| | |
|---|---|
| *H01L 27/146* | (2006.01) |
| *H01L 23/538* | (2006.01) |
| *H01L 27/144* | (2006.01) |
| *H01L 23/64* | (2006.01) |
| *H04B 10/69* | (2013.01) |
| *H04J 14/02* | (2006.01) |
| *H04B 10/40* | (2013.01) |

(52) U.S. Cl.
CPC ...... *H01L 23/5385* (2013.01); *H01L 23/5384* (2013.01); *H01L 23/642* (2013.01); *H01L 27/1443* (2013.01); *H01L 27/1446* (2013.01); *H04B 10/69* (2013.01); *H04J 14/02* (2013.01); *H04B 10/40* (2013.01)

(58) Field of Classification Search
None
See application file for complete search history.

(56) References Cited

U.S. PATENT DOCUMENTS

| | | | |
|---|---|---|---|
| 9,633,149 B2 | 4/2017 | Yen et al. | |
| 10,090,342 B1 * | 10/2018 | Gambino | H01L 27/14609 |
| 10,120,149 B1 | 11/2018 | Mathai et al. | |
| 2012/0181658 A1 | 7/2012 | Ilyas et al. | |

(Continued)

FOREIGN PATENT DOCUMENTS

| | | |
|---|---|---|
| CN | 110196106 | 9/2019 |
| WO | WO-2019048653 | 3/2019 |

OTHER PUBLICATIONS

Cosign; "Report on New Parallel Optics Transceiver Modules Based on 2.5D and 3D Integrated Components"; Dec. 21, 2016; 20 pages.

*Primary Examiner* — Benjamin P Sandvik
(74) *Attorney, Agent, or Firm* — Sheppard Mullin Richter & Hampton LLP

(57) ABSTRACT

A silicon interposer may include an on-chip DC blocking capacitor, comprising: a first electrical connection to couple to a supply voltage and to cathodes of a plurality of photodiodes formed in a two-dimensional photodiode array on a first substrate, and a second electrical connection to couple to ground and to ground inputs of a plurality of transimpedance amplifiers on a second substrate; wherein the on-chip DC blocking capacitor is configured to be shared among a plurality of receiver circuits comprising the plurality of photodiodes and the plurality of transimpedance amplifiers; and wherein the silicon interposer comprises a substrate separate from the first substrate and the second substrate.

20 Claims, 7 Drawing Sheets

(56) References Cited

U.S. PATENT DOCUMENTS

| | | |
|---|---|---|
| 2013/0230272 A1 | 9/2013 | Raj et al. |
| 2014/0084407 A1* | 3/2014 | Churchwell ........ H01L 27/1469 |
| | | 257/443 |
| 2018/0175230 A1* | 6/2018 | Droz ................. H01L 27/14614 |
| 2018/0198016 A1 | 7/2018 | Piccione et al. |
| 2020/0127029 A1* | 4/2020 | Meynants ......... H01L 27/14636 |

* cited by examiner

SILICON INTERPOSER FOR CAPACITIVE COUPLING OF PHOTODIODE ARRAYS

DESCRIPTION OF RELATED ART

Data communication growth is doubling every two years due to the massive growth of applications in cloud computing and mobile streaming, including with Internet of Things (IoT) and Artificial Intelligence (AI) applications. Optical PAM4 modulation with 4-levels of amplitude has emerged as a mainstream modulation scheme for the standardization of 400 Gb/s Ethernet (400bE) because it doubles the bit rate without doubling the required bandwidth. To achieve error-free PAM4 operation, a high-sensitivity receiver is highly preferred over conventional non-return-to-zero (NRZ) signaling due to a 4.8 dB fundamental modulation power penalty in PAM4 signaling. For wavelength division multiplexing (WDM) communications, multiple photodiodes are used to receive the individual channels of information.

BRIEF DESCRIPTION OF THE DRAWINGS

The present disclosure, in accordance with one or more various embodiments, is described in detail with reference to the following figures. The figures are provided for purposes of illustration only and merely depict typical or example embodiments.

The figures are not exhaustive and do not limit the present disclosure to the precise form disclosed.

DETAILED DESCRIPTION

Using avalanche photodiodes (APDs) to amplify the signal in receivers is a low-cost approach to improve receiver sensitivity and the link loss budget. Typically, APDs require a bias voltage (e.g., about 20 Volts), which needs to be isolated from the lower voltage (2-3V) CMOS transceiver. In order to use the required high voltage bias, a large capacitor (e.g., about 50 pF) in close proximity to the APDs is desirable as a direct current (DC) block between the high voltage supply and the CMOS chip, and as a means of providing an AC current return path, which is helpful for reducing crosstalk while using an APD array.

Because the DC block capacitor should be close to the APDs, embodiments of the disclosure provide an on-chip capacitor disposed on a silicon interposer. A two-dimensional (2D) APD array is one way to achieve a multiple channel or WDM transceiver for scaling the bandwidth. To have a low-cost and a high bandwidth density transceiver, the APD array can share a single large DC block capacitor whose capacitance has to be large enough (e.g., about 50 pF) to realize negligible crosstalk. The silicon interposer may be located between the APD array and the underlying printed circuit board (PCB). TSVs (through silicon vias) may be included to transfer the signals from the APDs above the interposer to the electrical connections below the interposer. The PCB could also be implemented as a CMOS chip to process the amplified photocurrent without first going through a PCB interface.

In various embodiments, the silicon interposer with the DC block capacitor may be wire bonded to the APD and the receiver (e.g., CMOS receiver). The silicon interposer on-chip capacitor with TSVs (through silicon vias) can be used for flip-chip bonding onto a 2D APD array. Thus, the embodiments may dramatically increase the APD receiver bandwidth density.

Figure 1:
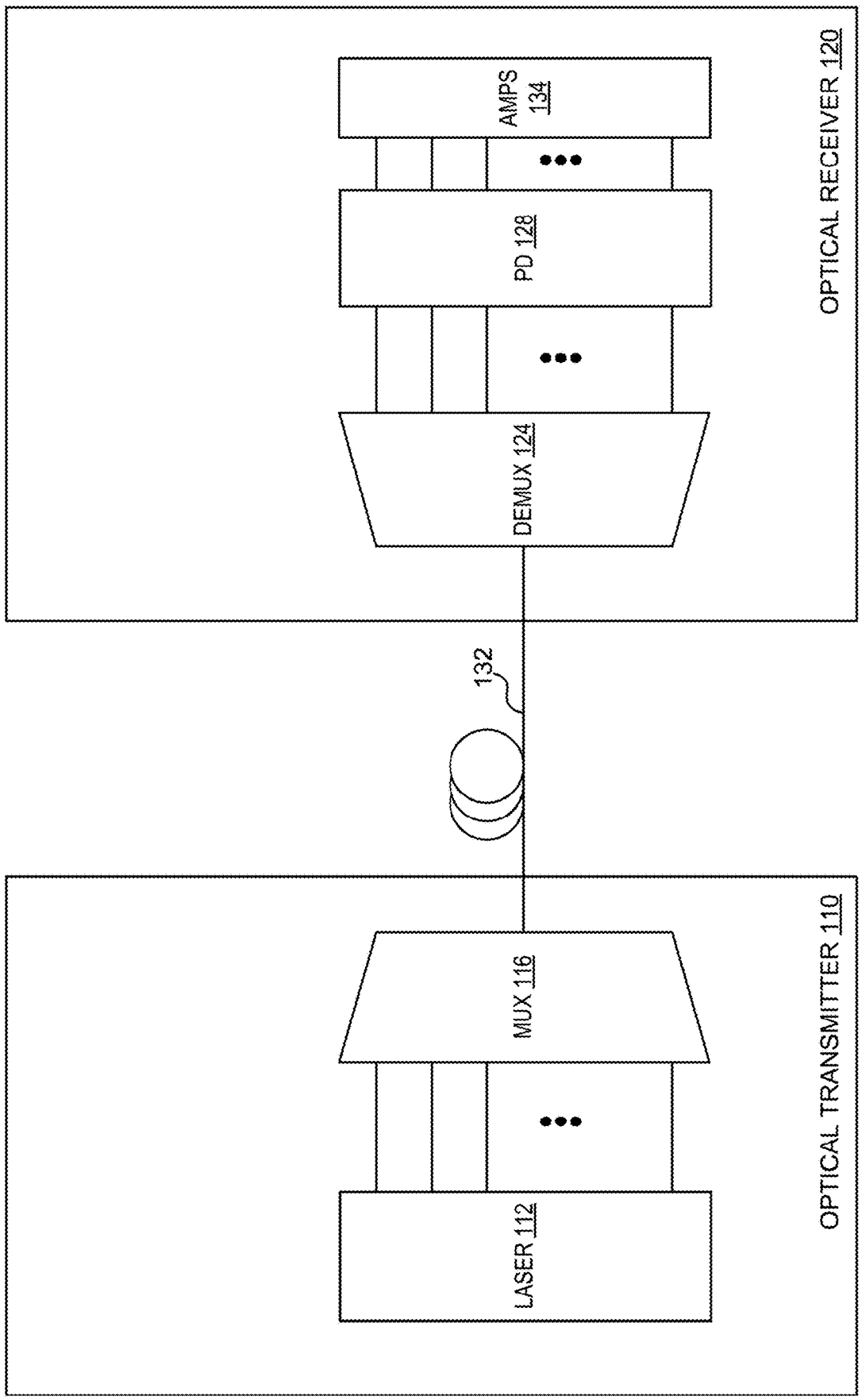
FIG. 1 is a diagram illustrating an example optical communication system with which embodiments may be implemented.

Before describing example embodiments in detail, it is useful to discuss one example application with which these and other embodiments may be implemented. FIG. 1 is a diagram illustrating an example optical communication system with which embodiments may be implemented. Referring now to FIG. 1, the example system includes an optical transmitter 110, an optical receiver 120 and an optical fiber communication link 130. This example optical transmitter 110 includes a transmit laser 112 to transmit data using an optical signal. In some embodiments, laser direct modulation can be used in which an IC driver can be provided to apply a modulated electrical signal to the laser to convert the electrical signal into an optical signal. In other embodiments, a continuous wave (CW) laser can be used and an optical modulator provided at the output of the laser to modulate the optical signal with the data.

The output of optical transmitter 110 is coupled to optical fiber 132 of the optical fiber communication link 130 via an optical coupler (not shown). At the receiving end, optical receiver 120 includes an optical coupler (not shown) to couple light from optical fiber 132 into a waveguide of optical receiver 120. Although the described example uses a waveguide receiver, the receiver may also be implemented using discrete components. A photodetector 128 (e.g., one or more photodiodes) may be included to detect the optical signal and convert it into an electrical signal for processing or storage. The current output from the photodiodes can be provided to their corresponding amplifiers 134, which may be implemented, for example, as transimpedance amplifiers. Although not illustrated, optical receiver 120 may also include for each channel a variable gain amplifier, equalization circuits (continuous time linear equalization and/or decision feedback equalization), a slicer (comparator), and so on. A more complex receiver may also include an analog to digital converter and a processor, such as a digital signal processor.

The example optical communication system may be implemented as a wavelength division multiplex (WDM) system capable of multiplexing and transmitting multiple channels of information across a single signal path (e.g., a single fiber 130). Accordingly, the communication system may include multiple lasers 112 and multiple photodetectors 128. Each laser 112 in the WDM system may be configured to produce a light signal at a designated wavelength, each of which may be referred to as a channel in the WDM system. The lasers 112 may include any of a number of different types of lasers including, for example, Vertical-Cavity Surface-Emitting Lasers (VCSELs), Distributed Bragg Reflex Lasers (DBRs), Distributed Feedback Lasers (DFBs), and other semiconductor lasers. In some embodiments, a comb laser may be used to provide a frequency comb, each wavelength of which may be modulated, for example, using an optical modulator for each frequency line. The WDM system may also include a multiplexer 118 to multiplex the multiple light signals from the lasers into a WDM optical signal. In WDM embodiments, modulation may occur individually for each channel (i.e., for each light source) such that each channel can carry different information. The multiplexed channels can then be launched onto optical fiber 132. At optical receiver 120, the WDM signal may be demultiplexed using a demultiplexer 124 to separate the WDM signal into its individual channels and each channel provided to its respective photodetector of multiple photodetectors 128.

In various implementations such as a silicon photonics application, the optical signals can be propagated through planar waveguide structures fabricated on a substrate. One example planar waveguide that may be used is a slab waveguide. The optical signals propagate within a planar slab of relatively high index material that is surrounded by a cladding having a lower index of refraction. A core/cladding interface exists at the boundary between the core region and the cladding region such that when light in the core region is incident upon this core/cladding interface at an angle greater than the critical angle, the light is reflected back into the core region. This serves to confine the light within the slab waveguide by total internal reflection, but some optical energy may exist within the cladding region outside the core. This is often referred to as evanescent energy or an evanescent field. The slab waveguide may be configured to carry a plurality of independent optical signals by providing ribs, ridges, strips or like structures extending along a side of the slab. The optical energy propagating within the slab may localized to different regions within the slab as defined by these structures.

Waveguides can be fabricated in a wide variety of geometries and configurations. A channel waveguide, such as a buried channel or embedded strip waveguide may generally include a core of relatively high index material that is surrounded by a cladding having a lower index of refraction. The substrate may form at least part of the surrounding cladding region.

A ridge or rib waveguide may also be used, and may be formed by depositing material on or removing material from (or both) selected regions of the slab, resulting in thickness variations in the slab waveguide. A strip-loaded waveguide may be formed by depositing a strip of material on the slab. The strip may have a refractive index that is greater than that of the cladding layers, but it may be approximately equal to that of the slab. The strip may be included to induce an increase in the effective index of the slab in the region proximate the strip. Although various integrated waveguide examples are provided, as noted above, in some implementations the receiver may be implemented using discrete components.

The couplers may be implemented as grating couplers having a flared waveguide portion with a relatively narrow end portion to engage the waveguide expanding to a wider end portion to couple to the fiber. The flared portion includes elongate scattering elements positioned to couple light between the coupler and an optical fiber or other optical element.

The communication system illustrated in and described above with respect to FIG. 1 is only one example of a communication system with which embodiments may be implemented. Embodiments may be implemented with any of a number of other optical communication systems.

Figure 2:
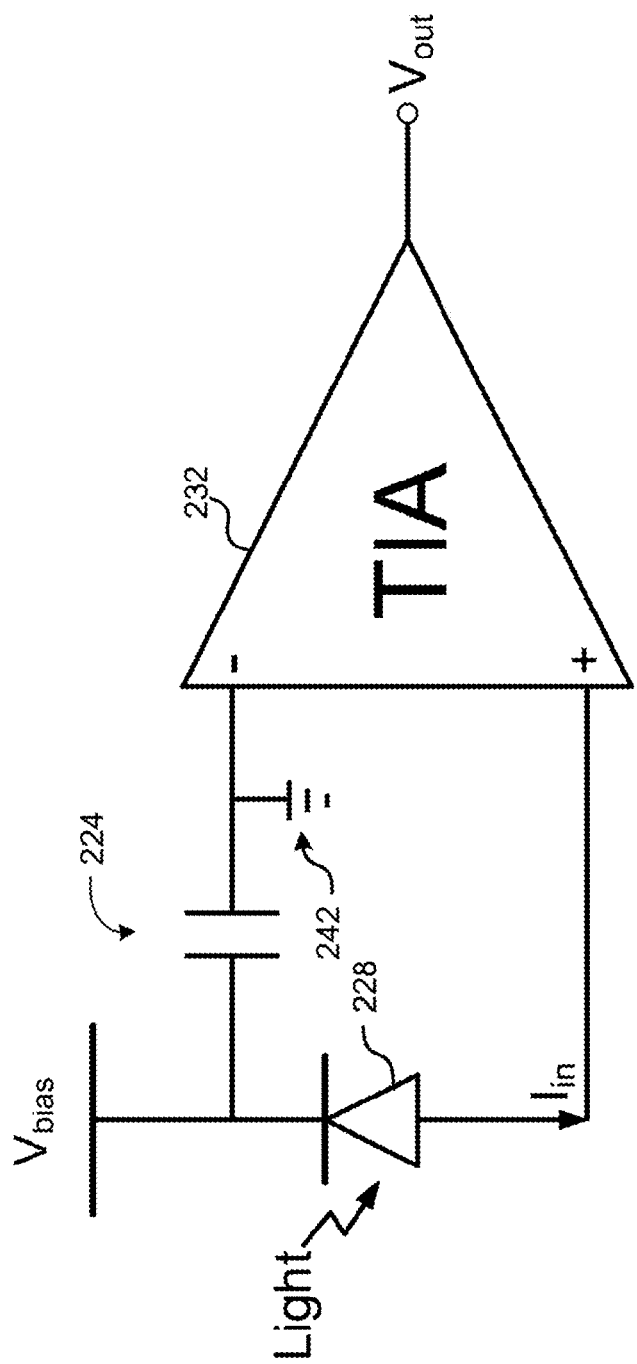
FIG. 2 is a diagram illustrating an example APD receiver circuit with which embodiments of the systems and methods disclosed herein may be implemented.

FIG. 2 is a diagram illustrating an example APD receiver circuit with which embodiments of the systems and methods disclosed herein may be implemented. The example receiver circuit in FIG. 2 includes a photodiode/transimpedance amplifier pair, which converts received light energy into electrical energy and amplifies the resultant electrical signal for processing. The photodiode in this example is a reverse-biased avalanche photodiode (APD) 228. An APD is a type of semiconductor photodiode device in which light energy is converted into electrical energy due to the internal photoelectric effect coupled with electric current multiplication as a result of avalanche breakdown. With APDs, incoming photons trigger a charge avalanche due to the application of a reverse bias voltage across the device. The reverse bias voltage should be large enough so that the generated electric field exceeds the impact ionization threshold for avalanche multiplication. A bias voltage, $V_{bias}$, supplies the reverse bias across APD 228. In this case, the bias voltage is approximately 20 Volts DC, although other voltage levels can be used for the bias voltage.

This example also includes a DC blocking capacitor 224 and an amplifier, which in this case is a transimpedance amplifier 232. Transimpedance amplifier 232 includes a first input (+) coupled to the anode of the APD 228 and a second input (−) coupled to ground 242, and coupled via capacitor 224 to the cathode of the APD 228.

In operation, light received at the receiver impinges upon the photodiode 228 (e.g., an APD). The photodiode 228 may convert optical signals into electrical signals by absorbing optical energy (e.g., photons) and moving electrons to a conduction band in response to absorbing the optical energy. The electrons in the conduction band are free electrons able to travel through the photodiode 228 in response to an electric field. The photodiode may internally amplify the electrical signal by accelerating the electrons until they free additional electrons through impact ionization. The photodiode 228 outputs the electrical signal ($I_{in}$) for use. Transimpedance amplifier 232 receives the electrical signal, $I_{in}$, at includes a first input (+) and amplifies the electrical signal for later processing. Capacitor 224 provides DC blocking to block the DC voltage from the second input of the transimpedance amplifier 232. In embodiments where a plurality of photodiodes are implemented as a photodiode array, a single capacitor 224 can be shared by the plurality of photodiodes. In further embodiments, the single capacitor can be fabricated upon an interposer, such as a Si interposer, coupled between the photodiode array and the amplifiers.

Figure 3:
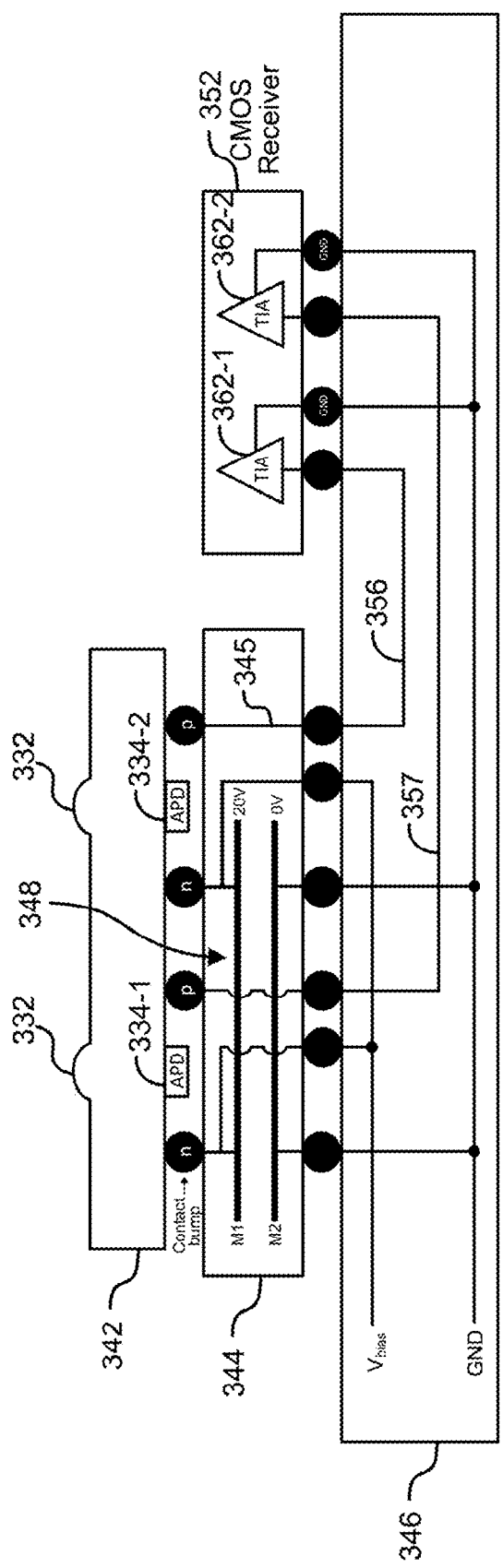
FIG. 3 is a diagram illustrating an example photodiode receiver structure using an interposer for the blocking capacitor in accordance with various embodiments.

In various implementations, capacitor 224 may be shared among multiple receiver circuits. More particularly, a single capacitor 224 may be used to provide DC blocking and allow for AC current return for multiple diode/amplifier pairs. In some embodiments, this capacitor may be implemented on an interposer situated between the photodiode array and the receiver circuits. FIG. 3 is a diagram illustrating an example photodiode receiver structure using an interposer for the blocking capacitor in accordance with various embodiments. Referring now to FIG. 3, this example photodiode receiver circuit includes a photodiode array 342, an interposer 344, a printed circuit board 346 and a receiver 352.

Photodiode array 342 may include a one-dimensional or two-dimensional array of photodiodes 334 arranged, in the case of a 2D array, in a pattern rows and columns. In some embodiments, photodiodes 334 may be implemented as avalanche photodiodes APDs 334 and micro lenses 332 may be included to focus the incoming light onto the avalanche photodiodes. Photodiode array 342 may be connected with interposer 344 using a number of techniques. In the illustrated example, photodiode array 342 is flip-chip bonded onto interposer 344 using a plurality of contact bumps. Similarly, interposer 344 and receiver 352 may be mounted onto printed circuit board 346 using any of a number of different mounting techniques, but in some embodiments they are flip-chip bonded onto printed circuit board 346.

Interposer 344 may be implemented as a silicon interposer and may include a blocking capacitor 348 fabricated thereon or therein. In the illustrated example, blocking capacitor 348 is implemented as a parallel plate capacitor with plates M1 and M2. Plate M1 of blocking capacitor 348 is connected to the bias voltage $V_{bias}$, which in this example is +20 V. Other voltage levels can be used. The connection to the voltage source is made via contact bumps to a $V_{bias}$ trace on printed circuit board 346. Plate M2 of blocking capacitor 348 is connected to ground. The ground connection is made via contact bumps to a ground plane on a printed circuit board 346.

Through silicon vias (TSVs) (one of which is labeled 345) can be provided in interposer 344 to provide a signal path from photodiode array 342 to printed circuit board 346 and receiver 352 to connect the photodiode/amplifier pairs. For example, through silicon via 345 connects the anode of APD 334-2 to the input of amplifier 362-1 via trace 356 on printed circuit board 346. A second through silicon via connects the anode of APD 334-1 to the input of amplifier 362-2 via trace 357 on printed circuit board 346. Similarly, through silicon via (reference character not included) connects the cathode of APD 334-1 to the bias voltage supply $V_{bias}$ on printed circuit board 346.

In this example, printed circuit board 346 includes a plurality of traces for bias voltage, $V_{bias}$, and ground, as well as to connect the anodes of the APDs 334 to the inputs of amplifiers 362. In various applications, printed circuit board 346 may be implemented to include other circuitry as may be appropriate for the given implementation. Receiver 352 includes a plurality of amplifiers (e.g., trans-impedance amplifiers) connected in this example to printed circuit board 346 via a plurality of contact bumps. Receiver 352 may also include for each channel a variable gain amplifier, equalization circuits (continuous time linear equalization and/or decision feedback equalization), a slicer (comparator), and so on. A more complex receiver may also include an analog to digital converter and a processor, such as a digital signal processor.

Figure 4:
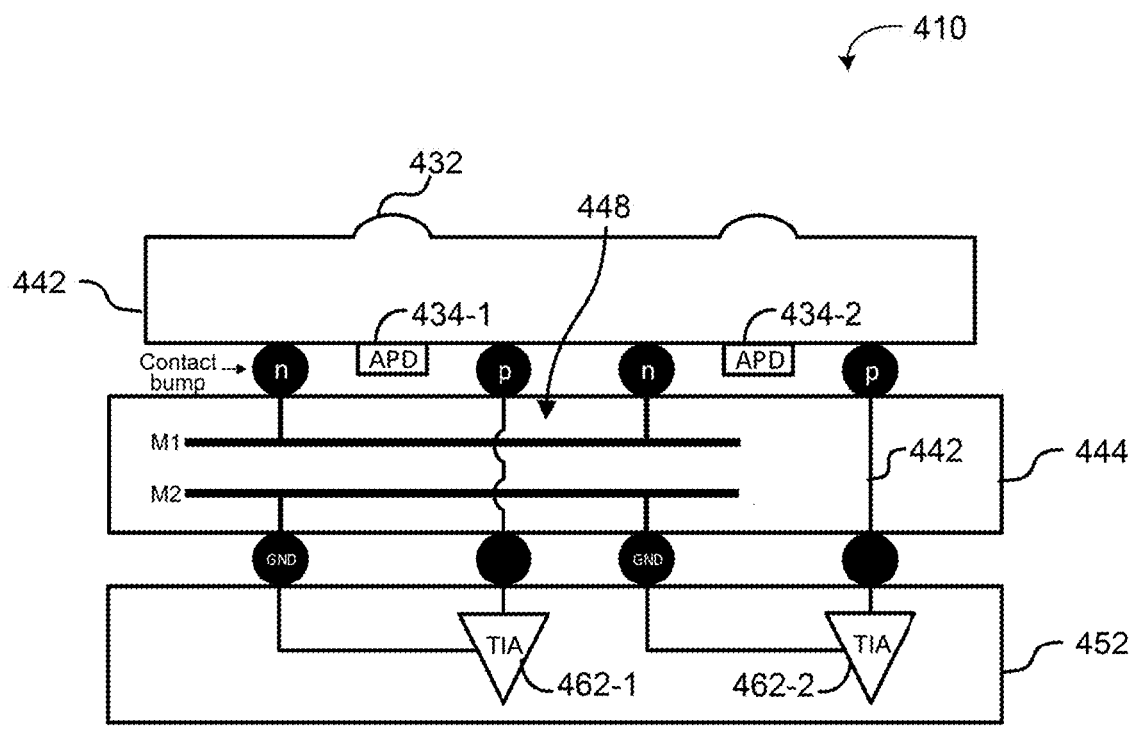
FIG. 4 is a diagram illustrating another example photodiode receiver structure using an interposer for the blocking capacitor in accordance with various embodiments.

FIG. 4 is a diagram illustrating another example photodiode receiver structure using an interposer for the blocking capacitor in accordance with various embodiments. In contrast to the example of FIG. 3, which uses a printed circuit board, the example of FIG. 4 shows an implementation in which the silicon interposer 444 is directly flip-chip bonded onto receiver 452. Like the example of FIG. 3, this interposer 444 may be implemented as a silicon interposer and may include a blocking capacitor 448 fabricated thereon or therein. In the illustrated example, blocking capacitor 448 is implemented as a parallel plate capacitor with plates M1 and M2. Plate M1 of blocking capacitor 448 is connected to the anodes of APDs 434 in APD array 442 and to the bias voltage supply $V_{bias}$ (not shown), and plate M2 of blocking capacitor 448 is connected to ground.

TSVs 442 can be provided to connect the photodiode/amplifier pairs. For example, through silicon via 442 connects the anode of APD 434-1 to the input of amplifier 462-1, and through silicon via 442 connects the anode of APD 434-2 to the input of amplifier 462-2.

Although the examples illustrated in FIGS. 3 and 4 show two APDs and two amplifiers, embodiments may be implemented with a different quantity of APDs and corresponding receivers/amplifiers, and, as noted above, the APDs may be implemented in a 2D array.

Figure 5B:
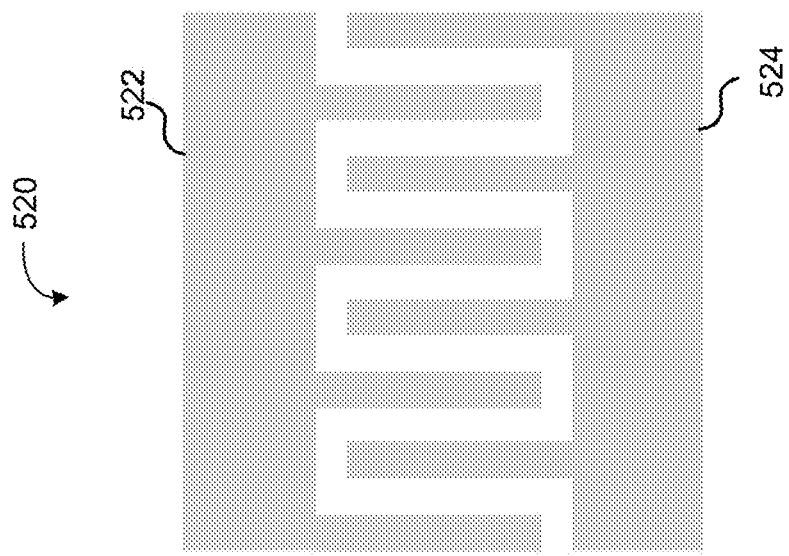
FIGS. 5A-5B illustrate two example implementations of a capacitor that may be implemented as a blocking capacitor in accordance with various embodiments.
Figure 5A:
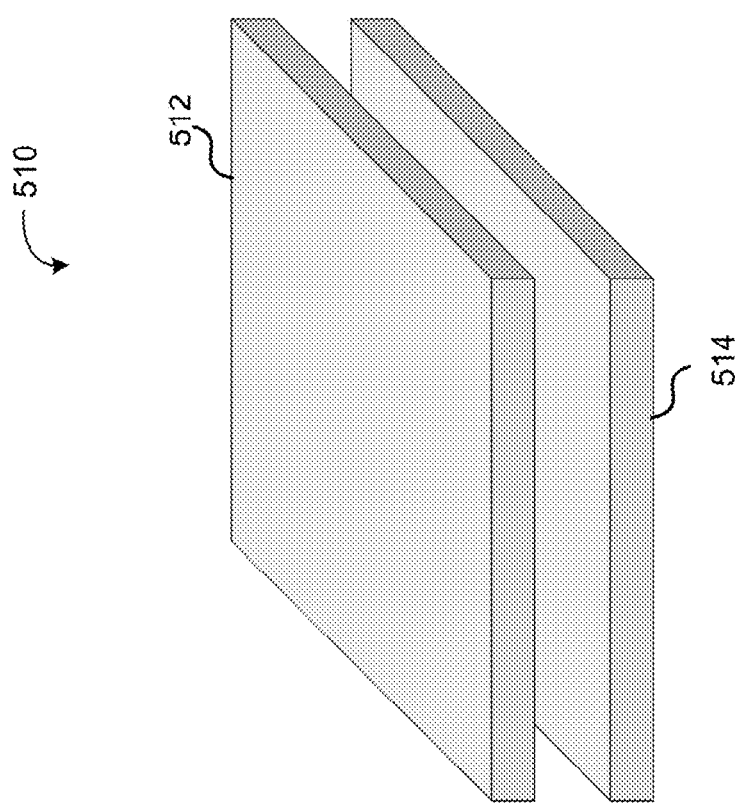

FIGS. 5A-5B illustrate two example implementations of a capacitor that may be implemented as a blocking capacitor in accordance with various embodiments. Referring now to FIG. 5A, capacitor 510 is a parallel plate capacitor having two plates 512, 514 (e.g., M1 and M2) arranged substantially parallel with one another. The capacitance of a parallel plate capacitor is proportional to the area, A, of a plate (the smallest of the two plates if they are different sizes) and inversely proportional to the distance or separation, d, between the two conductive plates. The capacitance of a parallel plate capacitor is given as $C=\varepsilon(A/d)$, where $\varepsilon$ represents the permittivity of the dielectric material between the two plates. The permittivity of a vacuum, $\varepsilon_o$, is $8.84 \times 10^{-12}$ Farads per meter. For the dielectric, its dielectric constant, or relative permittivity, $\varepsilon_r$, is factored in and the capacitance of a parallel plate capacitor is given as $C=\varepsilon_o \varepsilon_r (A/d)$. In various embodiments, a thin layer of silicon, silicon dioxide, silicon nitride, tantalum oxide or other dielectrics can be provided between the plates as the dielectric. Silicon may, in some embodiments, be a desirable dielectric as it has a higher permittivity than silicon nitride, for example. Plates 512, 514 configured to have an appropriate area and separation such that, given the dielectric material (and its permittivity) used between the plates, the desired amount of capacitance is achieved. In various embodiments, a capacitance of approximately 50 pF may be used. In other embodiments, other capacitances may be used.

The breakdown E-field for silicon is about $3\text{-}4 \times 10^5$ V/cm. Thus, for a parallel plate capacitor 510 with a silicon dielectric, the distance between the plates 512, 514 should be larger than 500 nm to avoid the breakdown in applications with a 20 Volt bias. In many applications, it is desirable to keep the distance between plates 512, 514 as small as possible to minimize the plate area. With this in mind, and using silicon as a dielectric, embodiments may be implemented using a plate dimension of about 500 um×500 um (or other dimensions that provide a similar plate area) to achieve a capacitance of 50 pF.

Referring to FIG. 5B, capacitor 520 is a planar microstrip interdigital capacitor, which is another example capacitor that may be used as the blocking capacitor. This example uses two patterns 522, 524 each including fingers arranged to extend into corresponding gaps in the opposing pattern. The finger widths, the gap between fingers, the gap at the end of the fingers, the length of the overlap region, the number of finger pairs and the width of the interconnect are parameters that may be adjusted to arrive at the desired amount of capacitance.

For an interdigital capacitor 520, again considering that the breakdown E-field for silicon is about $3\text{-}4 \times 10^5$ V/cm, the separation between the elements should be larger than 500 nm to avoid breakdown in applications with a 20 volt bias voltage. The interdigital capacitor area is determined by the silicon thickness and the total finger length. In one example, the total length can be 125 mm assuming 2 um thickness silicon. The product of each finger length and the quantity of fingers is the total length of one element, e.g. 250 fingers each 500 um in length. The finger width is not as critical as long as the material for the fingers has low resistance. To achieve low resistance, embodiments may implement a plurality of interdigital capacitors in parallel. For example, one embodiment might include twenty-five 10-finger interdigital capacitors in parallel to achieve 250 fingers.

Other embodiments may be implemented to provide a blocking capacitor. For example, while capacitor 510 is illustrated with two plates, other implementations can use more than two plates. Three or more plates can be provided in parallel in a stacked arrangement, with the plates separated by a dielectric material. For example, one set of plates connected to ground can be interleaved between another set of plates connected to the bias voltage. As another example, a three-plate configuration can include a ground plate or metal layer sandwiched between two biased or power plates or metal layers.

Figure 6:
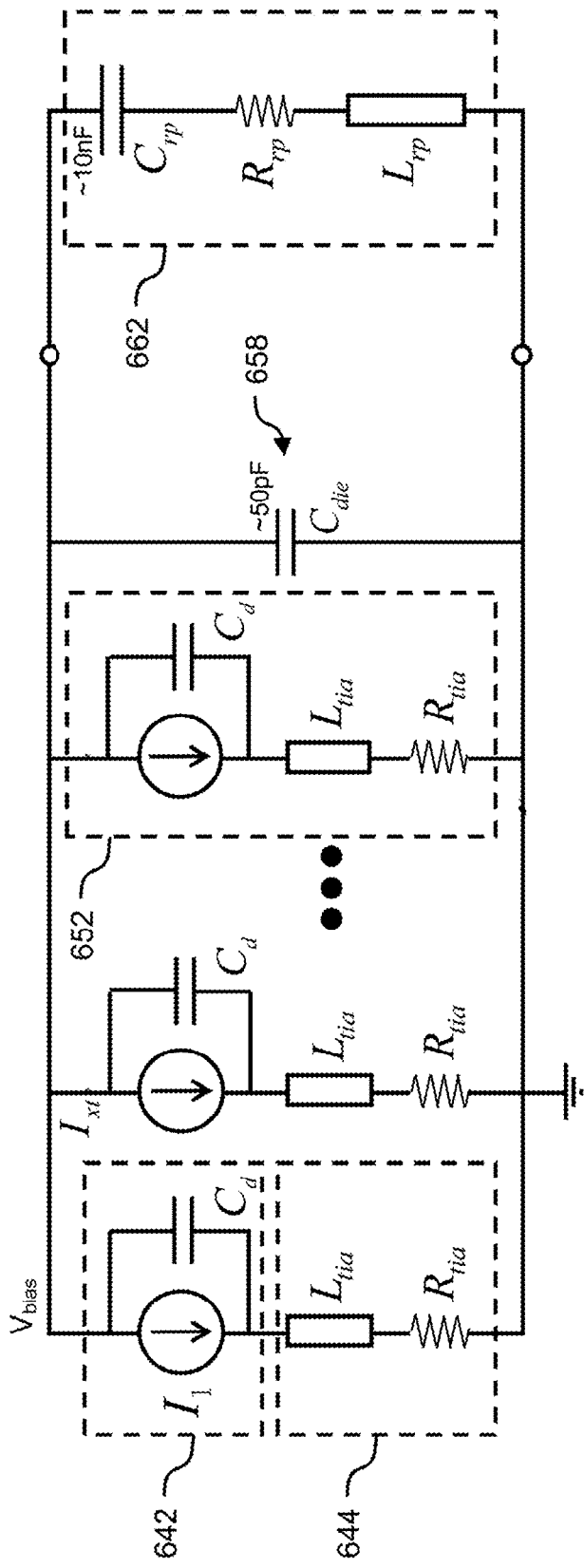
FIG. 6 illustrates an example of a modeling circuit that can be used to model the crosstalk performance of the device.

FIG. 6 illustrates an example of a modeling circuit that can be used to model the crosstalk performance of the device. Referring now to FIG. 6, this example provides an APD model 642 and a trans-impedance amplifier model 644 in combination to model an optical receiver 652. Voltage supply parasitics are modeled using model 662. In this example, the APDs are each modeled as a current source $I_1$ with a diode capacitor $C_d$ in parallel. The transimpedance amplifiers are each modeled as an inductor $L_{tia}$ with a resistor $R_{tia}$ in series. This example shows an APD receiver array, modeled as a plurality of APD receivers in parallel. This allows the system to estimate the crosstalk caused by the array. A single large shared capacitor $C_{die}$ 658 is also included in the model shown.

Figure 7:
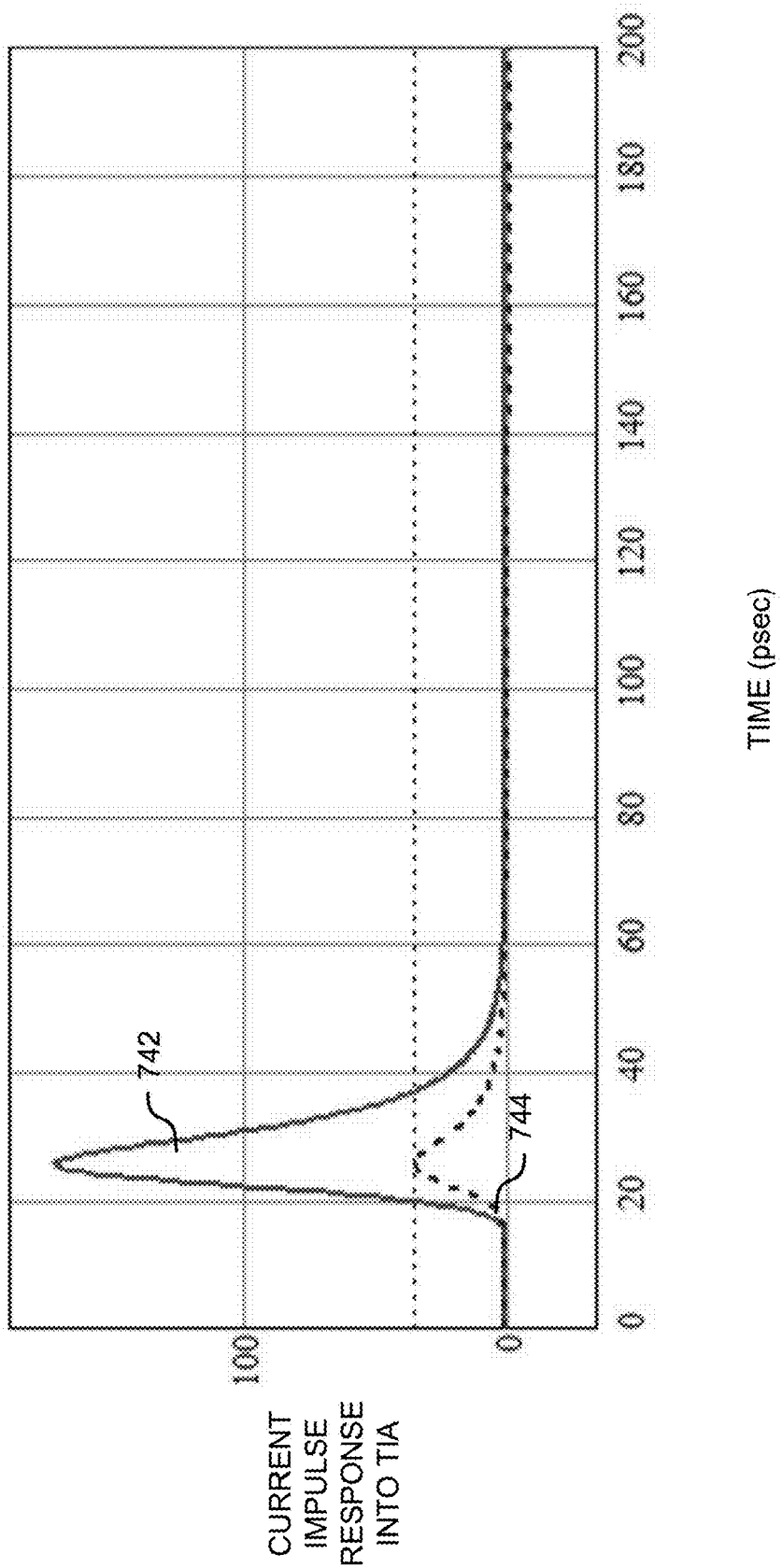
FIG. 7 is a diagram illustrating estimated crosstalk in accordance with the model of FIG. 6.

FIG. 7 is a diagram illustrating estimated crosstalk in accordance with the model of FIG. 6. Particularly, FIG. 7 illustrates the estimated crosstalk using an impulse response. In this example, an impulse was applied to one of the plurality of current sources shown in the example of FIG. 6 and the other current sources were left as non-active. Curve 742 illustrates the impulse response of the active avalanche photodiode (current source). Curve 744 is the crosstalk into one of the other inactive avalanche photodiodes in the array. In this example, the array was a 4×6 array of 24 avalanche photodiodes in total. The results show an estimated crosstalk of approximately 0.2%, with $R_{tia}$=60 ohms and $C_d$=100 fF. Accordingly, a capacitance of the shared bulk capacitor should be greater than 50 pF to achieve less than 1% total crosstalk with 24 active APD receivers (e.g., (0.2%×√23).

As used herein, the term "or" may be construed in either an inclusive or exclusive sense. Moreover, the description of resources, operations, or structures in the singular shall not be read to exclude the plural. Conditional language, such as, among others, "can," "could," "might," or "may," unless specifically stated otherwise, or otherwise understood within the context as used, is generally intended to convey that certain embodiments include, while other embodiments do not include, certain features, elements and/or steps.

Terms and phrases used in this document, and variations thereof, unless otherwise expressly stated, should be construed as open ended as opposed to limiting. Adjectives such as "conventional," "traditional," "normal," "standard," "known," and terms of similar meaning should not be construed as limiting the item described to a given time period or to an item available as of a given time, but instead should be read to encompass conventional, traditional, normal, or standard technologies that may be available or known now or at any time in the future. The presence of broadening words and phrases such as "one or more," "at least," "but not limited to" or other like phrases in some instances shall not be read to mean that the narrower case is intended or required in instances where such broadening phrases may be absent.

What is claimed is:

1. A silicon interposer, comprising:
   an on-chip DC blocking capacitor, comprising: a first electrical connection to couple to a supply voltage and to cathodes of a plurality of photodiodes formed in a two-dimensional photodiode array on a first substrate, and a second electrical connection to couple to ground and to ground inputs of a plurality of transimpedance amplifiers on a second substrate;
   wherein the on-chip DC blocking capacitor is configured to be shared among a plurality of receiver circuits comprising the plurality of photodiodes and the plurality of transimpedance amplifiers; and
   wherein the silicon interposer comprises a substrate separate from the first substrate and the second substrate.

2. The silicon interposer of claim 1, further comprising a plurality of through silicon vias to allow electrical interconnections between the plurality of photodiodes on the first substrate and the plurality of transimpedance amplifiers on the second substrate.

3. The silicon interposer of claim 1, wherein the silicon interposer is configured to be positioned between the first and second substrates and is configured to be directly connected to the first substrate and to the second substrate.

4. The silicon interposer of claim 1, wherein the silicon interposer is configured to be directly connected to first substrate and to be connected to the second substrate via a printed circuit board.

5. The silicon interposer of claim 1, wherein the first substrate with the two-dimensional photodiode array is flip-chip bonded to the silicon interposer.

6. The silicon interposer of claim 5, wherein the silicon interposer is directly flip-chip bonded onto the second substrate.

7. The silicon interposer of claim 1, wherein the on-chip DC blocking capacitor comprises one of a parallel plate capacitor and an interdigital capacitor.

8. The silicon interposer of claim 1, wherein the capacitance of the on-chip DC blocking capacitor is greater than 50 pF.

9. The silicon interposer of claim 1, wherein a crosstalk from one photodiode/transimpedance amplifier pair to another photodiode/transimpedance amplifier pair is less than 0.2%.

10. The silicon interposer of claim 1, wherein a crosstalk from one photodiode/transimpedance amplifier pair to another photodiode/transimpedance amplifier pair is less than 1%.

11. An optical receiver, comprising:
   a plurality of photodiodes disposed in a two-dimensional array on a first substrate, the plurality of photodiodes each comprising a first terminal for connecting to a bias voltage supply and a second terminal;
   a plurality of amplifiers disposed on a second substrate electrically coupled to the first substrate by a plurality of electrical interconnects, each interconnect of the plurality of electrical interconnects connecting a first input of one of the plurality of amplifiers to the second terminal of its corresponding photodiode; and
   a silicon interposer electrically coupled between the first substrate and the second substrate, the silicon interposer comprising:
      an on-chip DC blocking capacitor shared among the plurality of photodiodes and the plurality of amplifiers, the capacitor comprising a first terminal connecting electrically coupled to the bias voltage supply and to the first terminals of the plurality of photodiodes and a second terminal connecting to ground inputs of the plurality of amplifiers; and a plurality of TSVs to provide paths through the silicon interposer for the plurality of interconnects.

12. The optical receiver of claim 11, wherein the silicon interposer further comprises a plurality of through silicon vias to allow electrical interconnections between the plurality of photodiodes on the first substrate and the plurality of transimpedance amplifiers on the second substrate.

13. The optical receiver of claim 11, wherein the silicon interposer is configured to be positioned between the first and second substrates and is configured to be directly connected to the first substrate and to the second substrate.

14. The optical receiver of claim 11, wherein the silicon interposer is configured to be directly connected to first substrate and to be connected to the second substrate via a printed circuit board.

15. The optical receiver of claim 11, wherein the first substrate is flip-chip bonded to the silicon interposer.

16. The optical receiver of claim 15, wherein the silicon interposer is directly flip-chip bonded onto the second substrate.

17. The optical receiver of claim 11, wherein the on-chip DC blocking capacitor comprises one of a parallel plate capacitor and an interdigital capacitor.

18. The optical receiver of claim 11, wherein the capacitance of the on-chip DC blocking capacitor is greater than 50 pF.

19. The optical receiver of claim 11, wherein a crosstalk from one photodiode/transimpedance amplifier pair to another photodiode/transimpedance amplifier pair is less than 0.2%.

20. The optical receiver of claim 11, wherein a crosstalk from one photodiode/transimpedance amplifier pair to another photodiode/transimpedance amplifier pair is less than 1%.

* * * * *